United States Patent [19]

Ariye et al.

[11] Patent Number: 5,516,026
[45] Date of Patent: May 14, 1996

[54] PELLET BONDING APPARATUS

[75] Inventors: Makoto Ariye; Yasushi Takeda; Katsuyoshi Kawabe, all of Ebina, Japan

[73] Assignee: Toshiba Automation Co., Ltd., Kanagawa, Japan

[21] Appl. No.: 326,492

[22] Filed: Oct. 20, 1994

[30] Foreign Application Priority Data

Nov. 26, 1993 [JP] Japan .................................. 5-319261
Feb. 18, 1994 [JP] Japan .................................. 6-043336

[51] Int. Cl.⁶ .................................................. H01L 21/68
[52] U.S. Cl. ................................. 228/6.2; 228/49.1
[58] Field of Search ................................. 228/6.2, 49.1

[56] References Cited

U.S. PATENT DOCUMENTS 4,103,814  8/1978  Nishioka .................................. 228/6.2
5,351,872 10/1994  Kobayashi ............................... 228/6.2

FOREIGN PATENT DOCUMENTS 4-68553  3/1992  Japan .

*Primary Examiner*—Kenneth J. Ramsey
*Attorney, Agent, or Firm*—Finnegan, Henderson, Farabow, Garrett & Dunner

[57] ABSTRACT

A pellet bonding apparatus is disclosed, which comprises a wafer stage, a pellet removal/transfer mechanism, a pellet position correcting mechanism, and a bonding mechanism. In the wafer stage, the wafer ring unit can be rotated through an angle corresponding to each of a plurality of areas, into which a pellet group of a wafer ring unit provided on the wafer stage can be divided. The pellet position correcting mechanism rotates a rotary table through a predetermined angle irrespective of whether the wafer ring unit has been rotated or not, whereby pellet position correction is made such that the pellet has the same orientation at all times when being removed by the bonding mechanism. A sheet expander can set the wafer ring unit on the wafer stage. It has an expander ring with an end formed with air stream outlet ports. When a sheet of the wafer ring unit is supported on the end of the expander ring and expanded by lowering a wafer ring of the wafer ring unit with a press ring, an air layer is formed between the sheet and the expander ring end.

12 Claims, 8 Drawing Sheets

F I G. 1
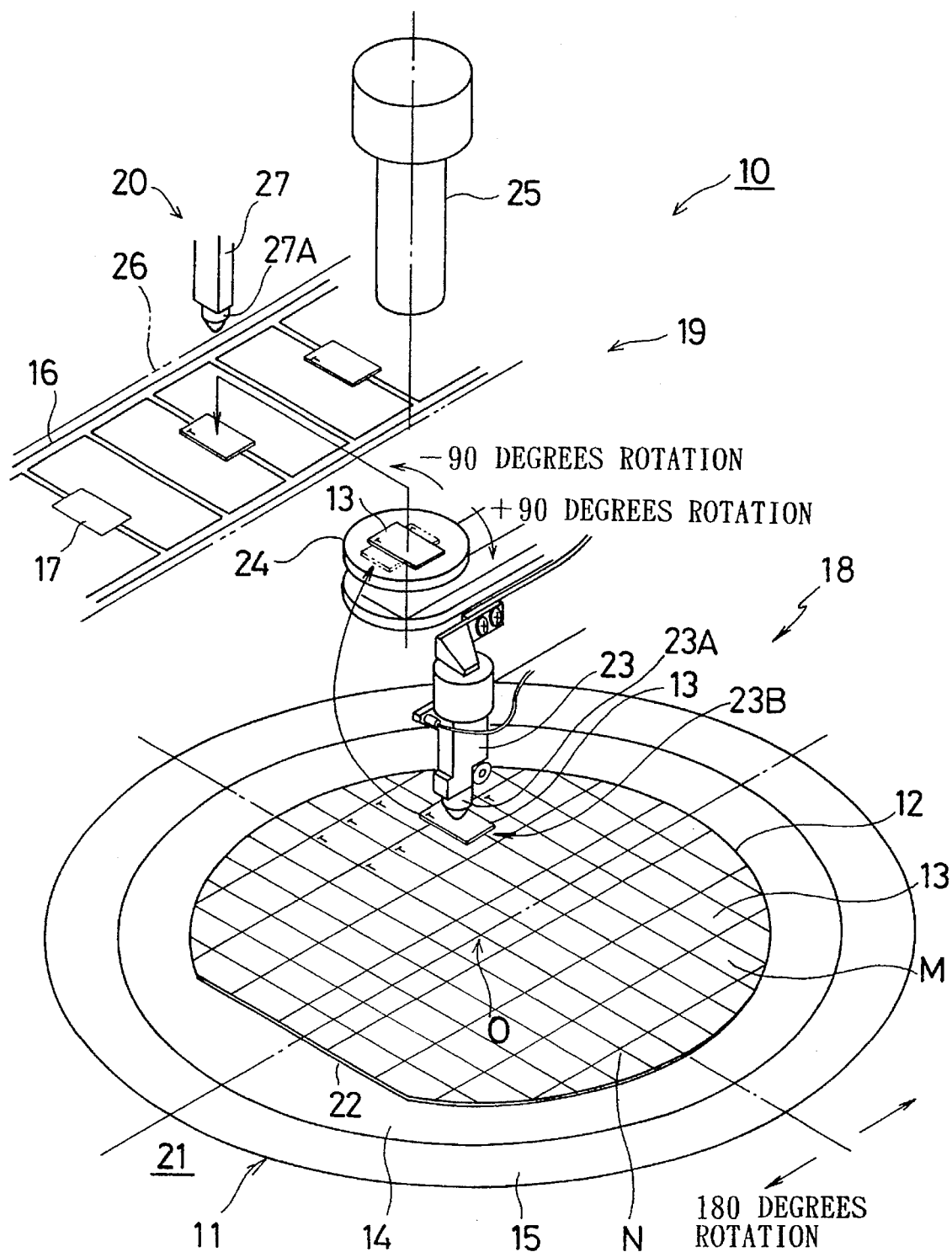

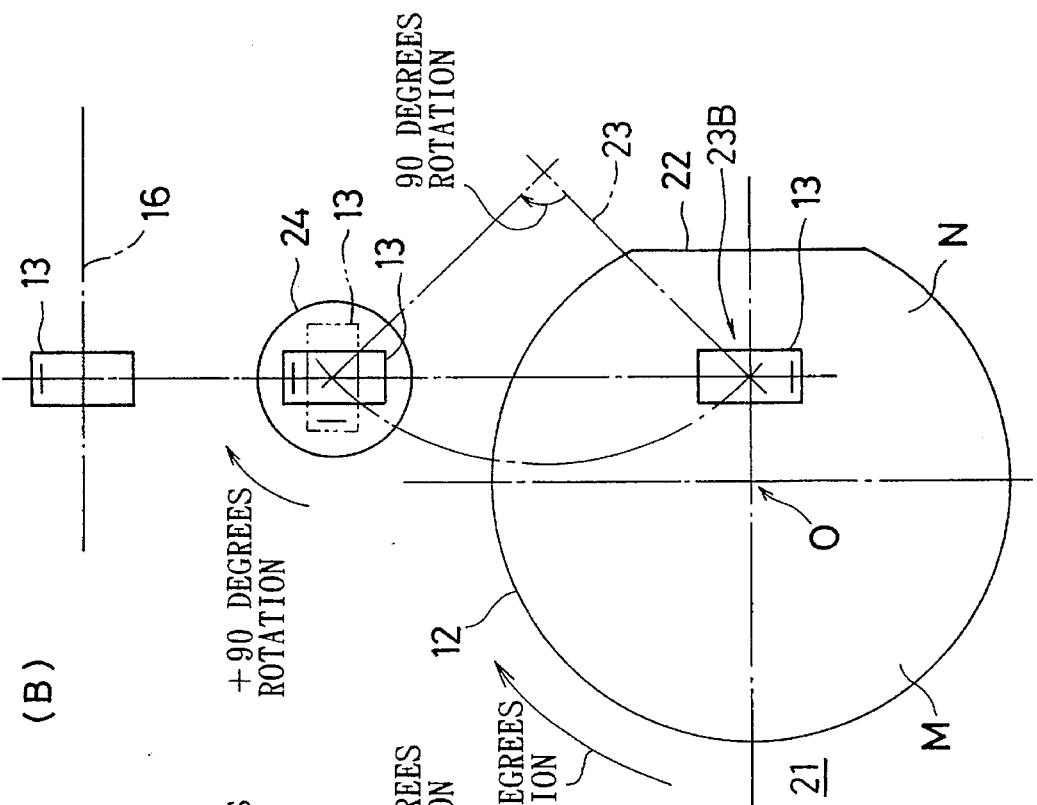
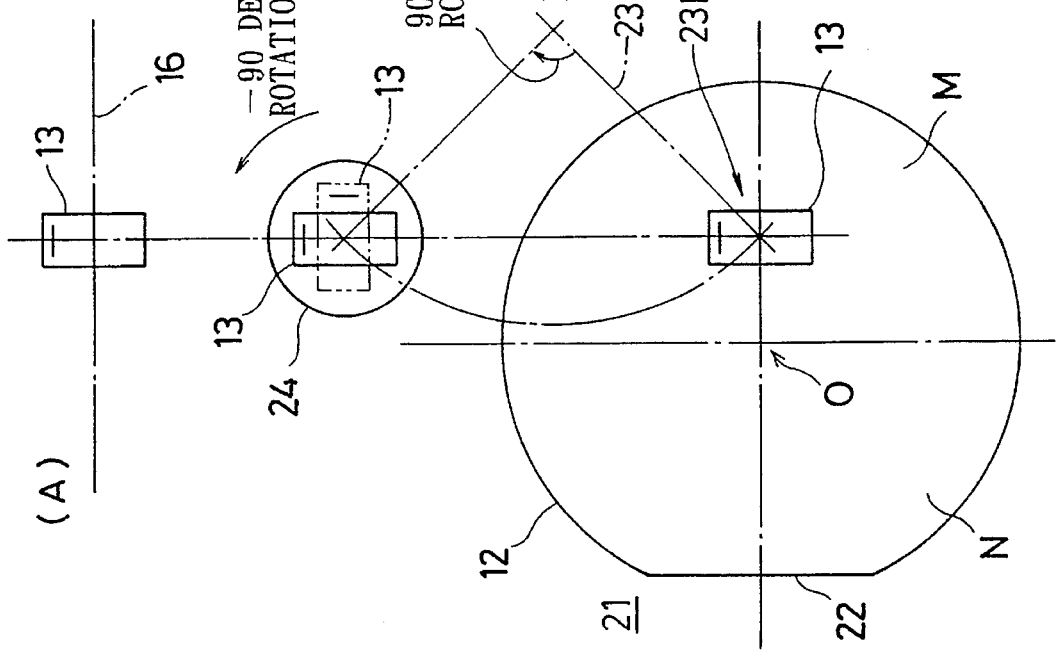

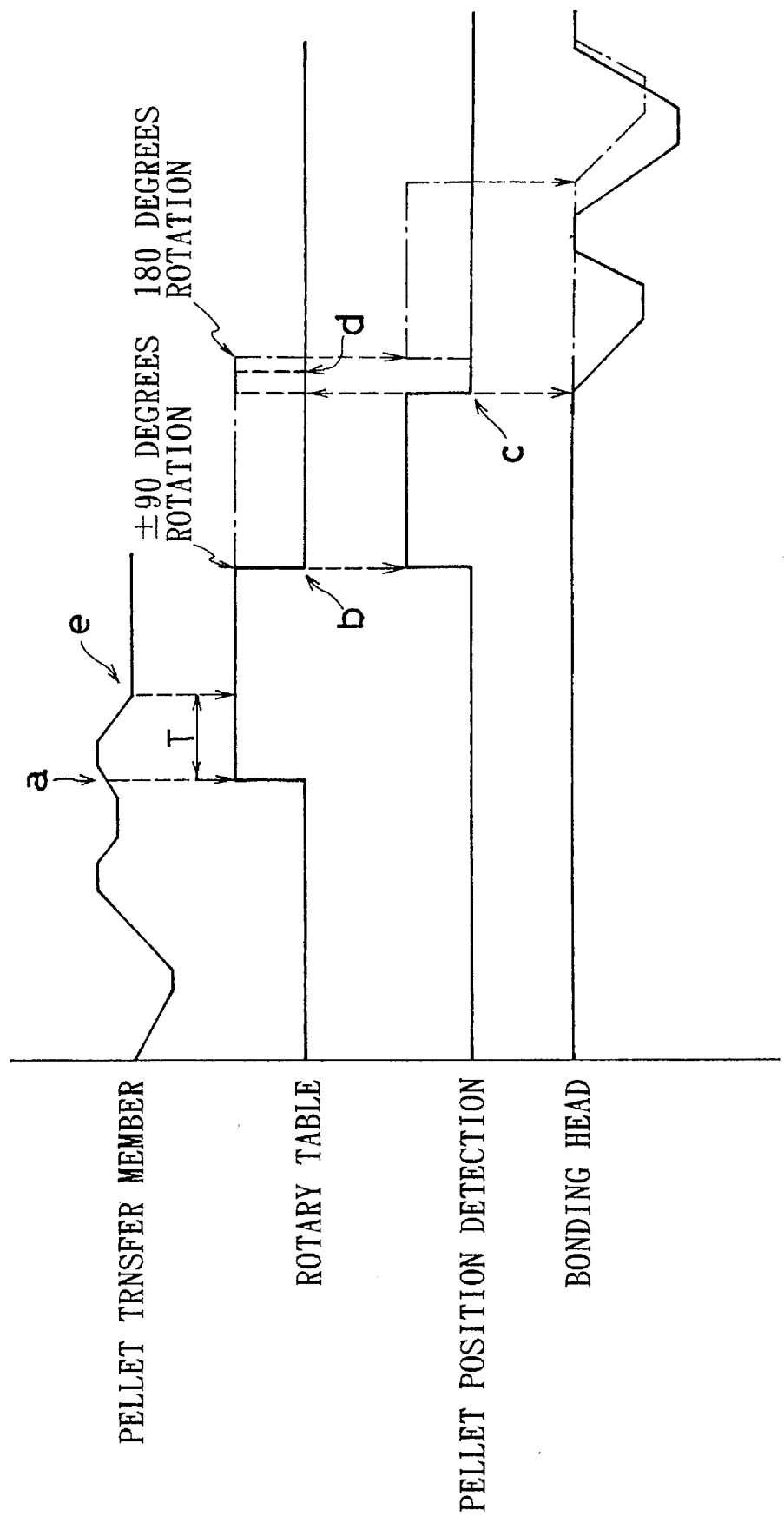

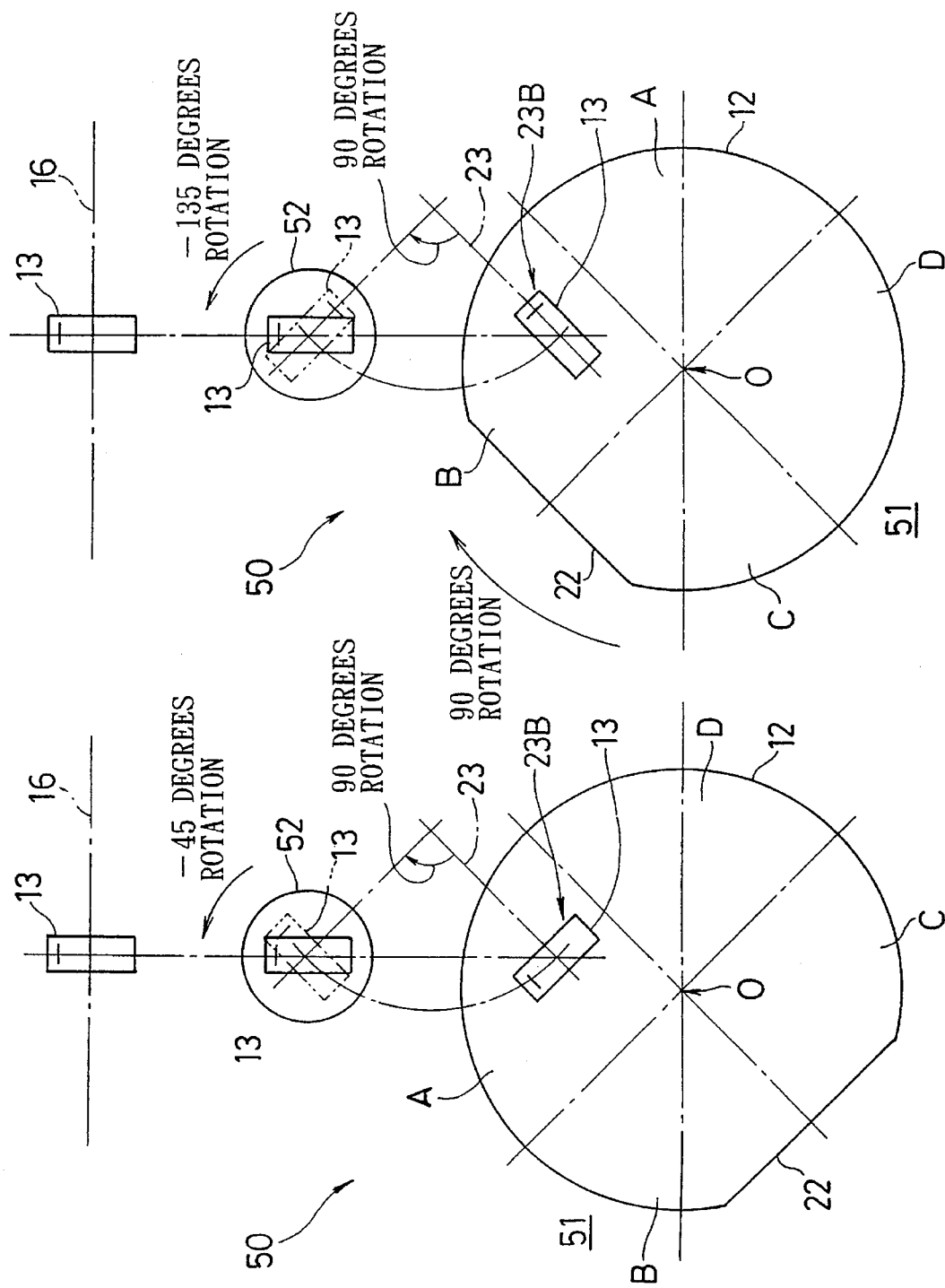

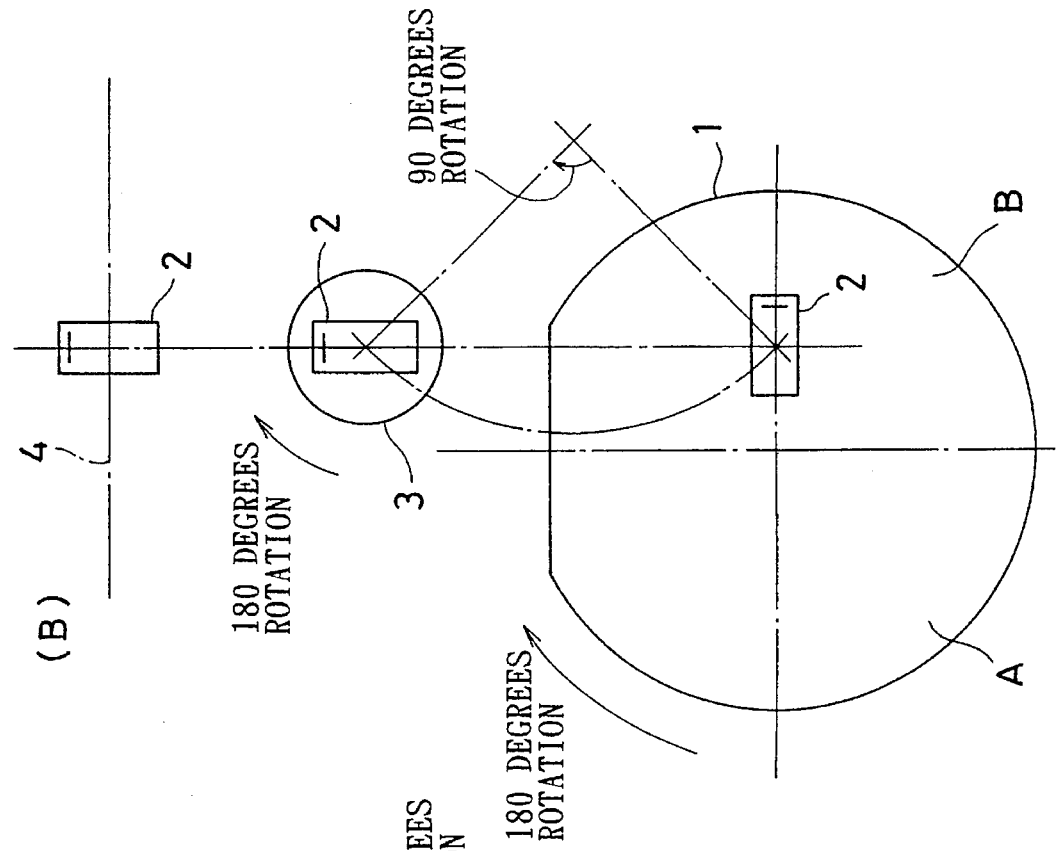
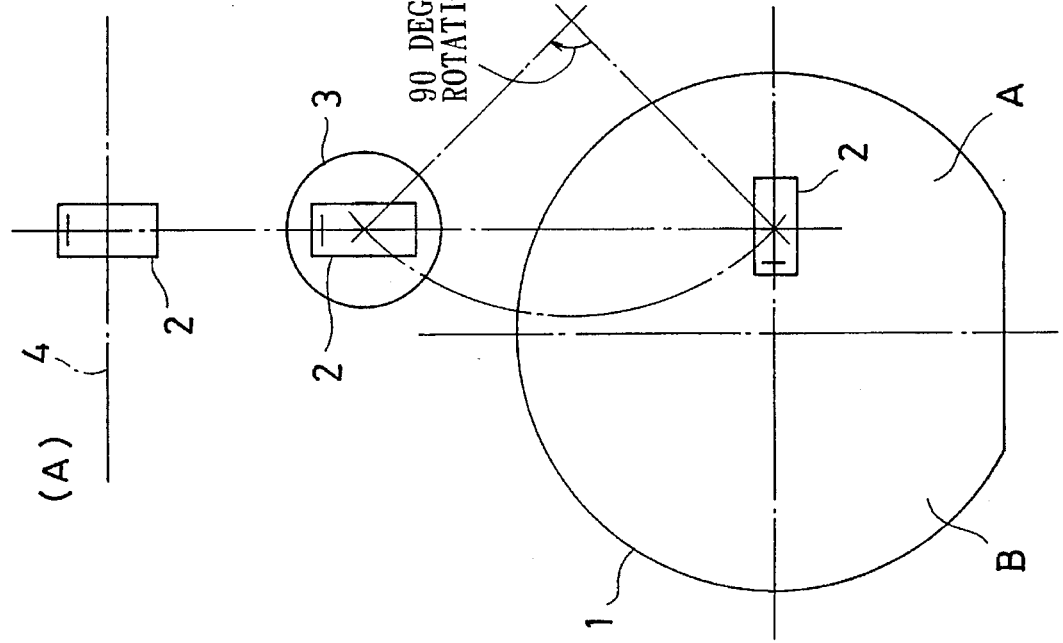

5,516,026

PELLET BONDING APPARATUS

BACKGROUND OF THE INVENTION

1. Field of the Invention

This invention relates to a pellet bonding apparatus used in semiconductor manufacture processes.

2. Description of the Background Art

As a process concerning semiconductor manufacture, there is a pellet bonding process using a pellet bonding apparatus. In this process, each pellet is taken out from a wafer ring unit installed on a wafer stage by a suction nozzle of a pellet removal/transfer unit, then put on a rotary table of a pellet position correcting mechanism, then corrected to make up for deviation of position, if necessary, by causing rotation of the rotary table, and then picked up from the rotary table and bonded to a lead frame by a suction nozzle of a bonding mechanism.

In this prior art pellet bonding apparatus, the suction nozzle of the pellet removal transfer mechanism removes a pellet 2 either in a right half area A of wafer 1, as shown in FIG. 9A, or in a left half area B of the wafer 1, as shown in FIG. 9B. In the former case of FIG. 9A, when the removed pellet 2 is put on the rotary table 3 of the pellet position correcting mechanism, its position is detected directly, i.e., without rotation of the rotary table 3, using a camera. Subsequently, its position is corrected, if necessary, by causing rotation of the rotary table 3. Then, it is removed from the rotary table 3 and bonded to a lead frame 4 by the suction nozzle of the bonding mechanism.

In the latter case of FIG. 9B, however, the wafer stage with the wafer ring unit installed thereon is rotated by 180 degrees for removing the pellet 2 from the area B of the wafer 1 with the suction nozzle of the pellet removal/transfer mechanism. Then, when the removed pellet 2 is put on the rotary table 3, the rotary table is rotated by 180 degrees and the position of the pellet 2 is detected using the camera. Then, the pellet 2 is corrected, if necessary, by causing rotation of the rotary table 3, and then bonded to the lead frame 4 using the suction nozzle of the bonding mechanism.

As is seen, in the latter case, in which the pellet 2 is removed from the area B of the wafer 1, it is necessary to rotate the rotary stage 3 by 180 degrees, thus producing a delay time till the end of rotation of the rotary table 3, as shown by phantom line in FIG. 3. That is, the delay time causes delay of the subsequent step of correcting the position (i.e., orientation) of the pellet 2 and step of bonding the pellet 2 by bonding head. As a consequence, increased time is required for the overall operation of bonding the pellets 2 in the areas A and B.

One pellet bonding apparatus of the above type has a wafer sheet expander for expanding a wafer sheet with a wafer applied thereto, as disclosed in, for instance, Japanese Patent Laid-Open No. Hei 4-68553.

The disclosed wafer sheet expander 101 is shown in FIG. 10. As shown, it includes an expander ring 102 and a Press ring 103 disposed on the outside of the expander ring 102 and capable of displacement in the axial direction of the expander ring 102. A wafer sheet 105 with a wafer 104 applied thereto, is put on the end of the expander ring 102, and it is expanded on the end of the expander ring 102 by pushing down the wafer ring 106, to which the wafer sheet 105 is secured, with the press ring 103.

With the expanding of the wafer sheet 105 caused in this way, gaps are formed between adjacent ones of a large number of pellets 107 into which the wafer 104 is diced, thus facilitating the take-up of each the pellets 107.

In this prior art example, however, with the lowering of the press ring 103 the wafer sheet 105 is expanded in direct contact with the end of the expander ring 102. Therefore, the frictional resistance between the wafer sheet 105 and the end of the expander ring 102 is so high as to possibly result in failure of uniformly expanding the wafer sheet 105.

SUMMARY OF THE INVENTION

A first object of the invention in view of the above circumstances is to provide a pellet bonding apparatus which permits the pellet bonding operation to be carried out in a short period of time.

A second object of the invention is to provide a pellet bonding apparatus, which has a wafer sheet expander for expanding a wafer sheet uniformly to form optimum gaps between adjacent pellets.

To attain the above first object of the invention, there is provided a pellet bonding apparatus, which comprises a wafer stage capable of installation thereon of a wafer ring unit having a group of pellets each separated from a wafer, a pellet removal/transfer mechanism for removing pellets one by one from the pellet group of the wafer ring unit at a pellet removal position and transferring each removed pellet, a pellet position correcting mechanism for setting each removed pellet on a rotary table and correcting the position of the pellet, and a bonding mechanism for removing each pellet having been position corrected by the pellet position correcting mechanism and bonding the removed pellet to a lead frame, the wafer stage permitting rotation of the wafer ring unit by each angle corresponding to each of a plurality of areas, which the pellet group of the wafer ring unit is divided into, the pellet position correcting mechanism being capable of correcting pellet position by causing rotation of the rotary table by a predetermined angle in either a forward or reverse direction independently of the rotation of the wafer ring unit such that each pellet has the same orientation when removed by the bonding mechanism.

Thus, according to the invention it is possible, regardless of whether the wafer stage has been rotated by a predetermined angle, to obtain the setting of the same pellet orientation at all times of removing a pellet with rotation of the rotary table of the pellet position correcting mechanism through a predetermined angle. It is thus possible to set the angle of rotation of the rotary table so that the required orientation correction is small. This means that it is possible to curtail time until the completion of the subsequent pellet bonding step executed by the pellet bonding mechanism. Thus, the pellet bonding operation as a whole can be done in a reduced period of time.

To attain the second object of the invention, there is provided a pellet bonding apparatus, which comprises a wafer stage capable of installation thereon via a sheet expander of a wafer ring unit having a sheet with wafer division pellets applied thereto, and a pellet removal/transfer mechanism for removing pellets one by one from the wafer ring unit and transferring each removed pellet, the sheet expander including an expander ring formed on an expander base provided on the wafer stage, the expander ring having an end capable of supporting the sheet, the end of the expander ring having a fluid outlet, a press ring disposed outside the expander ring, the press ring being capable of relative axial movement to the expander ring to cause the sheet supported on the end of the expander ring to be expanded to form a gap between adjacent ones of the pellets, and a fluid supply system capable of forming a fluid layer between the sheet and the end of the expander ring by supplying fluid to the fluid outlet.

Thus, according to the invention, with the end of the expander ring formed with a fluid outlet for providing a fluid stream therefrom, a fluid layer can be formed between the sheet and the end of the expander ring. It is thus possible, when the sheet is expanded with the relative movements of the press ring and the expander ring, to extremely reduce the frictional resistance between the sheet and the expander ring with the fluid layer. Consequently, the sheet can be expanded uniformly to form optimum gaps between adjacent ones of pellets.

To attain the first and second objects of the invention, there is provided a pellet bonding apparatus, which comprises a wafer stage capable of installation thereon via a sheet expander of a wafer ring unit having a sheet with wafer division pellets applied thereto, a pellet removal/transfer mechanism for removing pellets one by one from the pellet group of the wafer ring unit at a pellet removal position and transferring each removed pellet, a pellet position correcting mechanism for setting each removed pellet on a rotary table and correcting the position of the pellet, and a bonding mechanism for removing each pellet having been position corrected by the pellet position correcting mechanism and bonding the removed pellet to a lead frame, the wafer stage permitting rotation of the wafer ring unit by each angle corresponding to each of a plurality of areas, which the pellet group of the wafer ring unit is divided into, the pellet position correcting mechanism being capable of correcting pellet position by causing rotation of the rotary table by a predetermined angle in either forward or reverse direction independently of the rotation of the wafer ring unit such that each pellet has the same orientation when removed by the bonding mechanism, the sheet expander including an expander ring formed on an expander base provided on the wafer stage, the expander ring having an end capable of supporting the sheet, the end of the expander ring having a fluid outlet, a press ring disposed outside the expander ring, the press ring being capable of relative axial movement to the expander ring to cause the sheet supported on the end of the expander ring to be expanded to form a gap between adjacent ones of the pellets, and a fluid supply system capable of forming a fluid layer between the sheet and the end of the expander ring by supplying fluid to the fluid outlet.

Thus, according to the invention, when correcting the orientation of a pellet with the rotary table, it is possible to set the angle of rotation of the rotary table that is necessary for the orientation correction to be small, thus curtailing time till the completion of the subsequent pellet bonding step executed by the pellet bonding mechanism. Therefore, the pellet bonding operation as a whole can be done in a reduced period of time. Further, with the formation of the fluid layer between the sheet and the end of the expander ring by fluid flowing out from the fluid outlet formed in the expander ring, it is possible to reduce the frictional resistance between the sheet and the end of the expander ring, thus permitting uniform expanding of the sheet and optimization of the gap between adjacent pellets.

BRIEF DESCRIPTION OF THE DRAWINGS

The present invention will be more fully understood from the detailed description given below and from the accompanying drawings which should not be taken to be a limitation on the invention, but for explanation and understanding only.

The drawings:

FIG. 1 is a perspective view showing part of a first embodiment of the pellet bonding apparatus according to the invention;

FIG. 2A is a plan view showing the positional relation between a wafer and a pellet in the pellet bonding apparatus shown in FIG. 1 when a pellet transfer member removes a pellet from a pellet group in an area M of the wafer;

FIG. 2B is a plan view showing the positional relation between a wafer and a pellet in the pellet bonding apparatus shown in FIG. 1 when a pellet transfer member removes a pellet from a pellet group in an area N of the wafer;

FIG. 3 is a timing chart illustrating a pellet bonding step:

FIG. 7A is a plan view showing the positional relation between a wafer and a pellet in a second embodiment of the pellet bonding apparatus when a pellet transfer member removes a pellet from a pellet group in an area A of the wafer;

FIG. 7B is a plan view showing the positional relation between a wafer and a pellet in a second embodiment of the pellet bonding apparatus when a pellet transfer member removes a pellet from a pellet group in an area B of the wafer;

FIGS. 9A and 9B are plan views showing position relations between a wafer and a pellet in the prior art pellet bonding apparatus.

DESCRIPTION OF THE PREFERRED EMBODIMENTS

Figure 4:
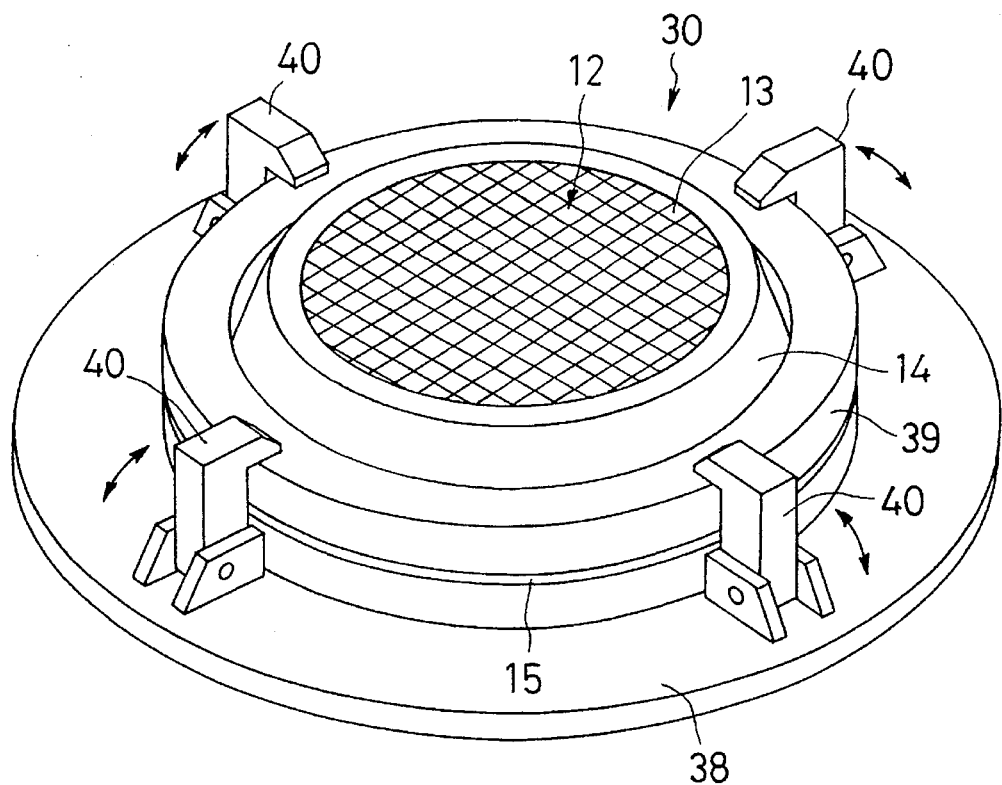
FIG. 4 is a perspective view showing a wafer sheet expander.

Now, a first embodiment of the invention will be described with reference to FIGS. 1 to 6.

FIG. 1 shows a pellet bonding apparatus 10. In the apparatus, a large number of pellets 13, which are made from a diced wafer 12, are removed one by one and bonded to each island section 17 of a lead frame 16. The apparatus comprises a wafer stage 21, a pellet removal/transfer mechanism 18, a pellet position correcting mechanism 19 and a bonding mechanism 20.

The wafer 12 is applied to a wafer ring 15 via an adhesive sheet 14, and it is installed as a wafer ring unit 11 on the wafer stage 21. The wafer 12 has a orientation flat 22 for confirming its orientation.

The wafer stage 21 includes a sheet expander 30 (which will be described later). The sheet expander 30 installs the wafer ring unit 11, and also it serves to expand the adhesive sheet 14 of the wafer ring unit 11 so as to increase gaps between pallets 13, thus facilitating the removal of each of the pellets 13 by the suction nozzle (to be described later) of a pellet transfer member 23. Where the pellet group (i.e., wafer 12) of the wafer ring unit 11 is divided into two areas, i.e., a right and a left half area M and N as shown in FIGS. 2A and 2B, upon completion of the removal of the pellets in either area, the wafer stage 21 causes 180-degree rotation of the wafer ring unit 11 about the axis O thereof. Thus, another area is successively brought to a pellet removal position 23B of the pellet transfer member 23 in the pellet removal/ transfer mechanism 18.

In the pellet removal/transfer mechanism 18 shown in FIG. 1, the pellet transfer member 23 takes out each pellet 13 from the wafer ring unit 11 installed on the wafer stage 21. The pellet transfer member 23 takes out the pellet 13 by suction of the suction nozzle 23A provided at its end, then is rotated by 90 degrees as shown in FIGS. 2A and 2B, and then sets the pellet 13 on a rotary table 24 of the pellet position correcting mechanism 19.

The pellet position correcting mechanism 19, as shown in FIG. 1, includes the rotary table 24, noted above, on which the pellet 13 removed by the pellet transfer member 23 is put on, and a position detection camera 25 for detecting the position of the pellet 13 on the rotary table 24. The rotary table 24 is disposed between a guide table 26 for guiding the lead frame 16 being transferred and the wafer stage 21. The position detection camera 25 is disposed right above the rotary table 24. The pellet position correcting mechanism 19 adequately corrects the position of the pellet 13 as will be described later in detail.

The bonding mechanism 20 includes a bonding head 27 having an end provided with a suction nozzle 27A. The suction nozzle 27A of the bonding head 27 picks up each pellet 13 having been position corrected on the rotary table 24 to the same orientation and secures the pellet 13 using an adhesive or the like to an island section 17 of the lead frame 16. The step of bonding the pellet 13 by the bonding head 27, as shown in FIG. 3, is carried out after the step of the pellet position correction by the rotary table 24.

The rotary table 24, as shown in FIGS. 1, 2A and 2B, can be rotated in the forward and reverse directions. More specifically, when the pellet transfer member 23 is removing a pellet 13 in the area M of the wafer 12, the rotary table 24 is rotated by −90 degrees. When the pellet transfer member 23 is removing a pellet 13 in the area N of the wafer 12, the rotary table 24 is rotated by 90 degrees. In this way, the rotary table 24 is rotated by 90 degrees in the direction of less rotation, whereby the pellet 13 is set to the same orientation. Subsequently, the position deviation of the pellet 13 is detected by the position detection camera 25. According to the detected value, the rotary table 24 is rotated, if necessary, for correcting the position of the pellet 13 on the rotary table 24 to a position, at which the bonding of the pellet 13 to the lead frame 16 by the bonding head 27 can be made adequately.

As shown in FIG. 3, the rotary table 24 starts to be rotated at an instant a after the pellet transfer member 23 has put the pellet 13 on the rotary table 24. The detection of the pellet position by the position detection camera 25 is started at an instant b after the end of rotation of the rotary table 24. The bonding head 27 starts to be lowered at an instant c after the end of the position detection by the position detection camera 25, and after an instant d of the end of the rotation of the rotary table 24, caused if necessary according to the result of the position detection by the position detection camera 25, it picks up the pellet 13 from the rotary table 24 and bonds the pellet 13. After the pellet 13 has been put on the rotary table 24 by the Pellet transfer member 23, the pellet transfer member 23 blocks the field of view of the position detection camera 25 until an instant e of restoration of the initial position of the pellet transfer member 23. For this reason, the pellet position detection is done after the lapse of a waiting time T.

Figure 5:
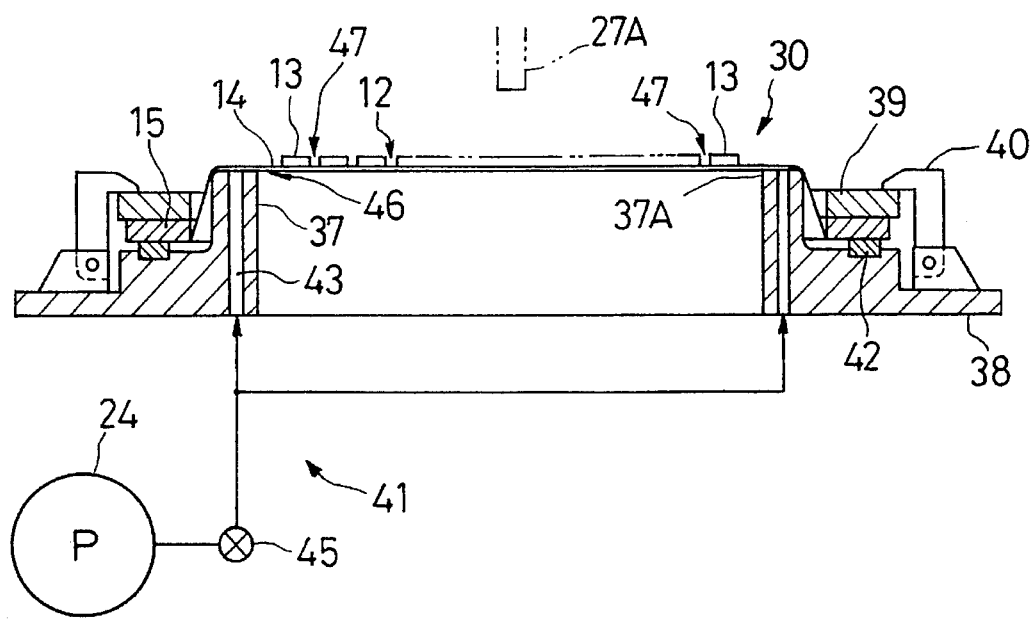
FIG. 5 is a sectional view showing the wafer sheet expander shown in FIG. 4.

The sheet expander 30 is disposed on the wafer stage 21, and as shown in FIGS. 4 and 5 it includes an expander base 38 having an expander ring 37, a press ring 39, a plurality of stopper pawls 40, and an air supply system 41.

The expander ring 37 is erected inside the expander base 38 such that its end 37A can support the adhesive sheet 14. The press ring 39, having a ring-like form, is disposed on the outside of the expander ring 37 such that it can be displaced in the axial direction of the expander ring 37. The press ring 39 can lower the wafer ring 15 when the adhesive sheet 14 is supported on the end of the expander ring 37.

The stopper pawls 40 are floatingly supported upright by such support means as springs (not shown). They are provided on the expander base 38 at a suitable interval around the outer periphery of the expander ring 37. They serve to be in contact with the top surface of the press ring 39 so as to prevent the press ring 39 from being floated by reaction force from the adhesive sheet 14 (to be described later) which has been expanded. In the expander base 38, an elastic support member 42 is embedded at a position right under the press ring 39 when the press ring 39 is disposed on the outside of the expander ring 37, and it positions the wafer ring 15 lowered by the press ring 39.

Figure 6:
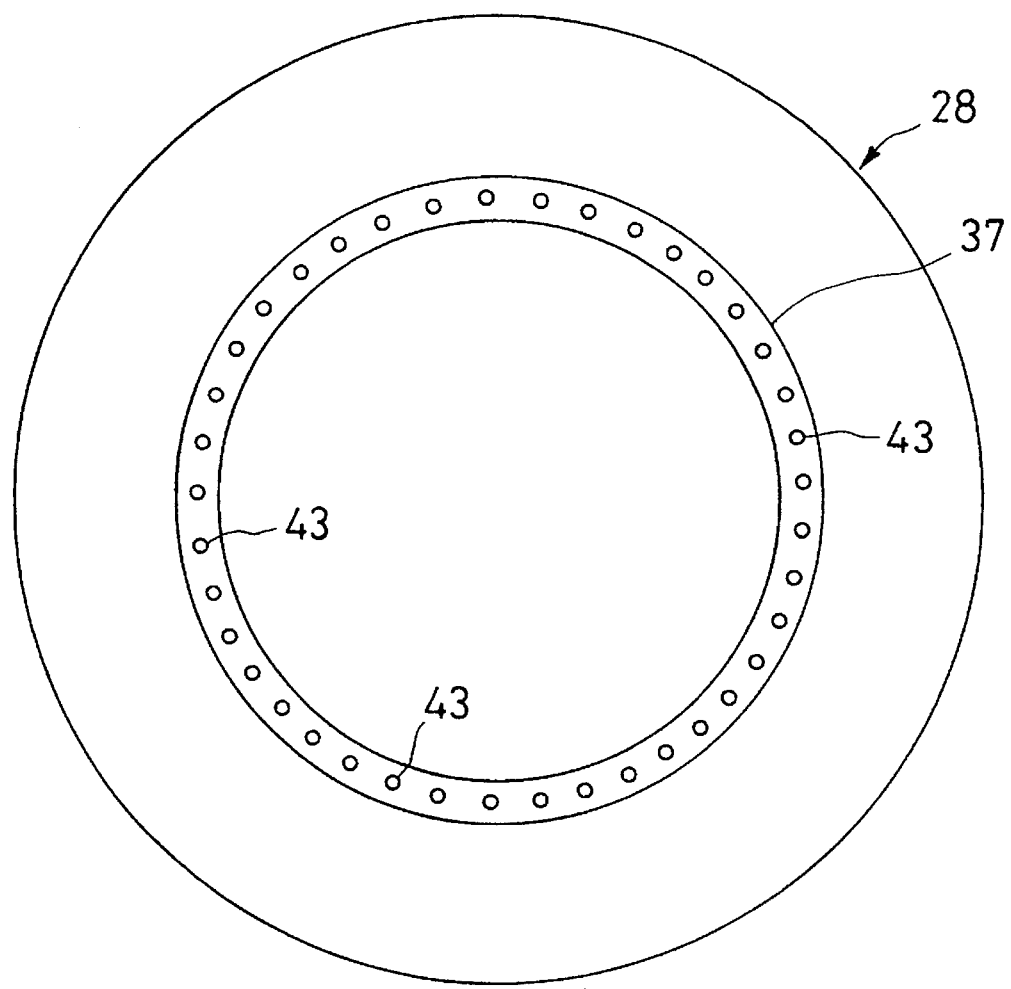
FIG. 6 is a plan view showing an expander base shown in FIG. 4.
Figure 10:
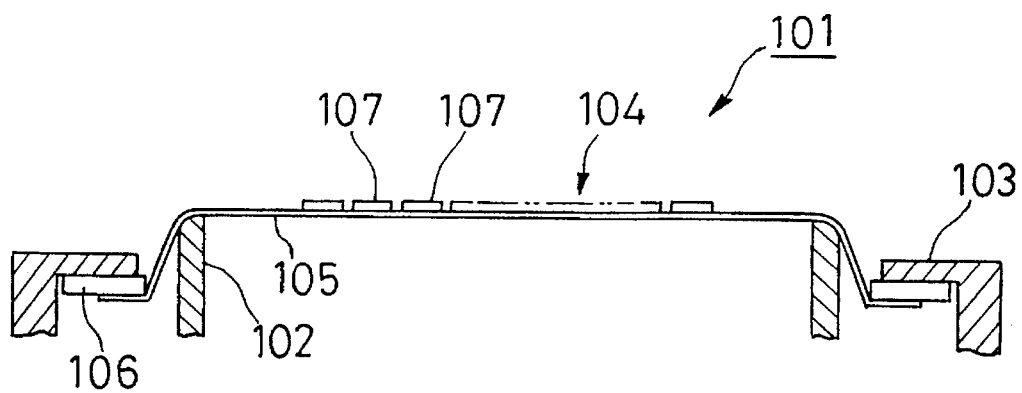
FIG. 10 is a sectional view showing a prior art wafer sheet expander.
Figure 8A:
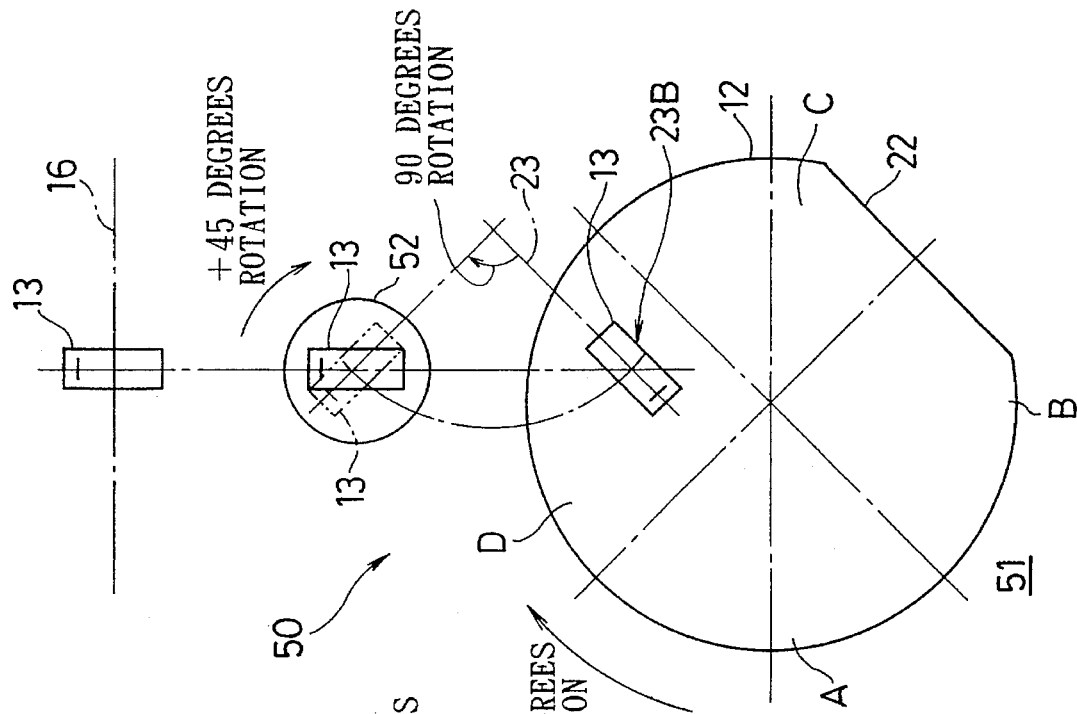
FIG. 8A is a plan view showing the positional relation between a wafer and pellet in a second embodiment of the pellet bonding apparatus when a pellet transfer member removes a pellet from a pellet group in an area C of the wafer.
Figure 8B:
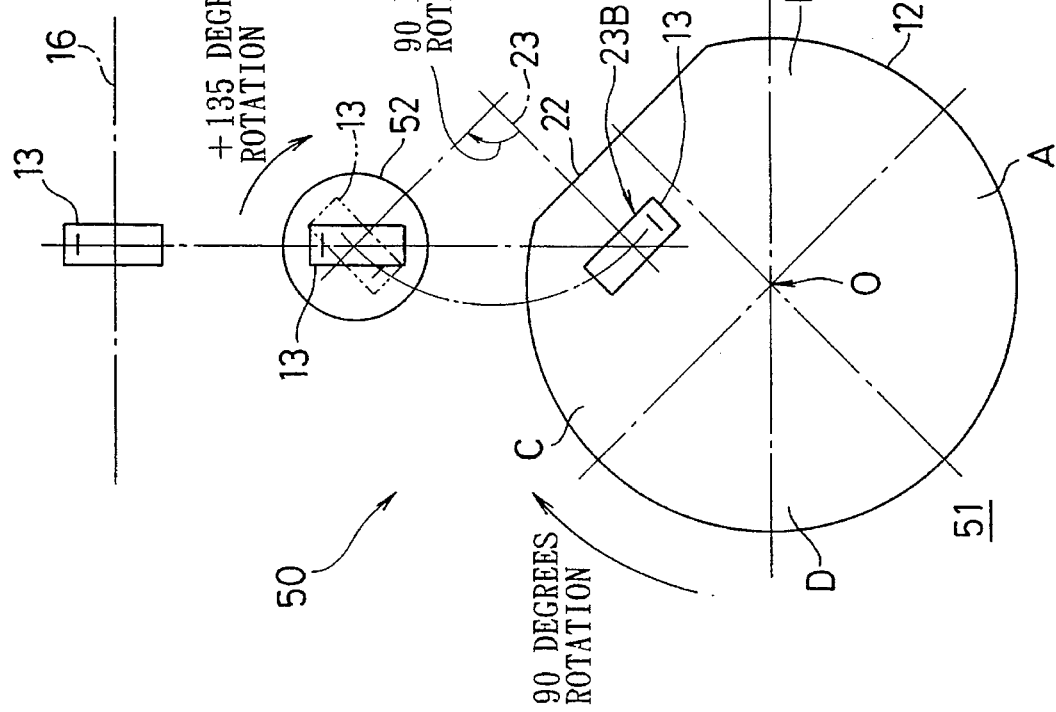
FIG. 8B is a plan view showing the positional relation between a wafer and pellet in a second embodiment of the pellet bonding apparatus when a pellet transfer member removes a pellet from a pellet group in an area D of the wafer.

The expander ring 37, as shown in FIGS. 5 and 6, has its end 37A formed with many air outlet ports 43 as a fluid outlet. The air outlet ports 43 are formed over the entire circumference of the expander ring 37. The air supply system 41 supplies air to the air outlet ports 43, and it includes a compressor 44 and an electromagnetic valve 45. When the electromagnetic valve 45 is turned on, air is supplied from the compressor 44 to the air outlet ports 43 and flows out from these ports 43, whereby an air layer 46 is formed as a fluid layer between the adhesive sheet 14, which is supported on the end 37A of the expander ring 37, and the end 37A. When the electromagnetic valve 45 is turned off, air supplied to the air outlet ports 43 is cut off.

Now, the function of the sheet expander 30 will be described.

First, the adhesive sheet 14 with the wafer 12 applied thereto is set on the end 37A of the expander ring 37 of the sheet expander 37. Then, the press ring 39 is put on the top surface of the wafer ring 15 supporting the adhesive sheet 14. Afterwards, the electromagnetic valve 45 is turned on, thus forming the air layer 46 between the end 37A of the expander ring 37 and the adhesive sheet 14.

In this state, the press ring 39 is manually pushed down to cause the adhesive sheet 14 to expand. Afterwards, the adhesive sheet 14 is held in the expanded state with the press ring 39 held by the stopper pawls 40 against floating. The electromagnetic valve 45 is held "on" at least from the start till the end of the expanding of the adhesive sheet 14 by the press ring 39.

In the above embodiment, as shown in FIGS. 1, 2A and 2B, the rotary table 24 of the pellet position correcting mechanism 19 is rotated by 90 degrees both when the pellet transfer member 23 is removing a pellet 13 in the area M and when the member 23 is removing a pellet 13 in the area N after 180-degree rotation of the wafer ring unit 11. In this way, the position (i.e., orientation) of the pellet 13 set on the rotary table 24 is corrected.

In the prior art example as shown in FIGS. 9A and 9B, when the pellet transfer member is removing the pellet 2 in the area A of the wafer 1, the rotary table 3 is not rotated, and when the pellet transfer member is removing the pellet 2 in the area B, the rotary table 3 is rotated by 180 degrees for position correction of the pellet 2 on the rotary table 3. In this prior art example, while the pellet 2 in the area B is removed, the detection of the position of the pellet 2 by the camera and the bonding of the pellet 2 by the bonding head can be made only after the rotary table 3 has been rotated by 180 degrees, as shown by phantom line in FIG. 3. Therefore, the operation of bonding the pellet 2 in the area B takes a long time. Besides, as described before, when removing the pellet 2 in the area A without rotation of the rotary table 3, it is necessary for the camera to wait at least for time T until restoration of the initial position of the pellet transfer member. Therefore, also the operation of bonding the pellet 2 in the area A can not be carried out in a short period of time.

In contrast, in this embodiment the initial position of the pellet transfer member 23 is restored while the rotary table 24 is rotated by 90 degrees. This means that the position detection camera 25 can start the position detection immediately after the completion of rotation of the rotary table 24 without need of taking the wait time T till the restoration of the pellet transfer member 23 into considerations. Besides, the rotary table 24 is rotated only by 90 degrees, and the rotation requires short time. Thus, regardless of whether the pellet transfer member 23 is removing the pellet 13 in the area M or N of the wafer 1, it is possible to cause the pellet position detection by the position detection camera 25 to be started quickly, thus permitting the pick-up of the pellet 13 by the bonding head 13 to be completed quickly. Thus, the pellet bonding operation as a whole, to bond the pellets 13 in the areas M and N, can be done in a reduced period of time.

Further, as shown in FIGS. 4 to 6, in the sheet expander 30 the end 37A of the expander ring 37 is formed with air outlet ports 43, from which air flows out to form the air layer 46 between the adhesive sheet 14 and the end 37A of the expander ring 37. The air layer 46 has an effect of extremely reducing the frictional resistance offered between the adhesive sheet 14 and the end 37A of the expander ring 37 when the wafer ring 15 is pushed down by the press ring 39. Thus, it is possible to uniformly expand the adhesive sheet 14 to form optimum gaps 47 between adjacent pellets 13 of the wafer 1.

A second embodiment of the invention will now be described with reference to FIGS. 7A, 7B, 8A and 8B. In the second embodiment, parts like those in the preceding first embodiment are designated by like reference numerals and are not described.

In the second embodiment of the pellet bonding apparatus 50, wafer stage 51 is rotated successively by 90, 180, 270 and 360 degrees, and rotary table 52 of pellet position correcting mechanism 19 is rotated through angles corresponding to the rotation angles of the wafer stage 51.

Where the pellet group of wafer ring unit 11 is divided into four areas A to D each subtending 90 degrees, the wafer stage 51 successively brings the areas A to D to pellet removal position 23B of pellet transfer member 23 of pellet removal/transfer mechanism 18 by successively causing 90-degree rotation of the wafer ring unit 11 about the axis O thereof.

The rotary table 52 can be rotated in both the forward and reverse directions, and the direction of its rotation is set to a direction, in which less amount of the rotation is necessary for the pellet position correction, according to the area of the pellet group that has been brought to the pellet removal position 23B of the pellet transfer member 23. Specifically, the rotary table 52 is rotated by −45 degrees (FIG. 7A) when the pellet 13 in the area A is removed by the pellet transfer unit 23, by −135 degrees (FIG. 7B) when the pellet 13 in the area B is removed, by +135 degrees (FIG. 8A) when the pellet 13 in the area C is removed, and by +45 degrees (FIG. 8B) when the pellet 13 in the area D is removed.

With the rotation of the rotary table 52 by ±45 and ±135 degrees as described above, the orientation of the Pellet 13 on the rotary table 52 is aligned. Subsequently, the deviation of the position of the pellet 13 is detected by position detection camera 25, and the rotary table 52 is rotated, if necessary, according to the detected value to effect the correction. Then, the pellet 13 on the rotary table 52 is bonded adequately to the lead frame 16 by the bonding head 27.

Again in the second embodiment, the initial position of the pellet transfer member 23 is restored while the rotary table 52 is rotated by ±45 or ±135 degrees, and thus the position detection camera 25 starts position detection immediately after completion of rotation of the rotary table 52. Besides, the rotary table 52 is rotated by ±135 degrees at the most, and the rotation requires shorter time than the 180-degree rotation in the prior art case. Thus, irrespective of whichever one of the areas A to D of the pellet group, from which a pellet 13 is being removed by the pellet transfer member 23, it is possible to cause the start of the position detection by the position detection camera 25 and the removal of the pellet 13 by the bonding head 27 quickly and the pellet bonding operation as a whole can be done in a reduced period of time.

Further, while in the above embodiments the fluid outlet of the sheet expander 30 was the air outlet ports 43, it is possible to provide, instead, an air outlet groove formed circumferentially in the expander ring 37. The fluid supplied may be inert gases or like gases as well as air.

Further, while in the above embodiments the press ring 39 was displaced manually in the axial direction of the expander spring 39, it is possible to move the press ring 39 with a cylinder or like drive source. As a further alternative, it is possible to move the expander base 38 in lieu of the press ring 39.

While the preferred embodiments of the invention have been described in detail with reference to the drawings, they are by no means limitative, and various changes and modifications are possible without departing from the scope and spirit of the invention.

Although the invention has been illustrated and described with respect to several exemplary embodiments thereof, it should be understood by those skilled in the art that the foregoing and various other changes, omissions and additions may be made to the present invention without departing from the spirit and scope thereof. Therefore, the present invention should not be understood as limited to the specific embodiment set out above but to include all possible embodiments which can be embodied within a scope encompassed and equivalents thereof with respect to the feature set out in the appended claims.

What is claimed is:

1. A pellet bonding apparatus comprising:
   a wafer stage capable of installation thereon of a wafer ring unit having a group of pellets each separated from a wafer;
   a pellet removal/transfer mechanism for removing pellets one by one from the pellet group of the wafer ring unit at a pellet removal position and transferring each removed pellet;

a pellet position correcting mechanism for setting each removed pellet on a rotary table and correcting the position of the pellet; and a bonding mechanism for removing each pellet having been position corrected by said pellet position correcting mechanism and bonding the removed pellet to a lead frame;

said wafer stage permitting rotation of the wafer ring unit through each angle corresponding to each of a plurality of areas, which the pellet group of the wafer ring unit is divided into;

said pellet position correcting mechanism being capable of correcting pellet position by causing rotation of the rotary table through a predetermined angle in either forward or reverse direction independently of the rotation of the wafer ring unit such that each pellet has the same orientation when removed by said bonding mechanism.

2. The pellet bonding apparatus according to claim 1, wherein said pellet position correcting mechanism can select the direction of rotation of the rotary table according to the area of the pellet group that has been brought to the pellet removal position of said pellet removal/transfer mechanism with the rotation of the wafer ring unit.

3. The pellet bonding apparatus according to claim 1, wherein when correcting the orientation of each pellet by causing rotation of the rotary table by a predetermined angle, said pellet position correcting mechanism can select the direction of rotation of the rotary table, in which less amount of the rotation thereof is required for the correction.

4. The pellet bonding apparatus according to claim 1, wherein:

when the pellet group of the wafer ring unit is divided into two areas, i.e. areas M and N, said wafer stage successively brings the areas M and N to the pellet removal position of said pellet removal/transfer mechanism by causing 180-degree rotation of the wafer ring unit for each area; and the pellet position correcting mechanism causes 90-degree rotation of the rotary table in opposite directions when a pellet is removed by said pellet removal/transfer mechanism from the area M and when a pellet is removed from the area N.

5. The pellet bonding apparatus according to claim 2, wherein:

when the pellet group of the wafer ring unit is divided into two areas, i.e., areas M and N, said wafer stage successively brings the areas M and N to the pellet removal position of said pellet removal/transfer mechanism by causing 180-degree rotation of the wafer ring unit for each area; and the pellet position correcting mechanism causes 90-degree rotation of the rotary table in opposite directions when a pellet is removed by said pellet removal/transfer mechanism from the area M and when a pellet is removed from the area N.

6. The pellet bonding apparatus according to claim 3, wherein:

when the pellet group of the wafer ring unit is divided into two areas, i.e., areas M and N, said wafer stage successively brings the areas M and N to the pellet removal position of said pellet removal/transfer mechanism by causing 180-degree rotation of the wafer ring unit for each area; and the pellet position correcting mechanism causes 90-degree rotation of the rotary table in opposite directions when a pellet is removed by said pellet removal/transfer mechanism from the area M and when a pellet is removed from the area N.

7. The pellet bonding apparatus according to claim 1, wherein:

when the pellet group of the wafer ring unit is divided circumferentially into four areas, i.e., areas A to D, each subtending 90 degrees, said wafer stage successively brings the four areas A to D to the pellet removal position of said pellet removal/transfer mechanism by causing 90-degree rotation of the wafer ring unit for each area; and said pellet position correcting mechanism causes 45-degree rotation of the rotary table in one direction when a pellet is removed by said pellet removal/transfer mechanism from the area A, causes 135-degree rotation of the rotary table in afore-said one direction when a pellet is removed from the area B, causes 135-degree rotation of the rotary table in the other direction when a pellet is removed from the area C, and causes 45-degree rotation of the rotary table in the afore-said other direction when a pellet is removed from the area D.

8. The pellet bonding apparatus according to claim 2, wherein:

when the pellet group of the wafer ring unit is divided circumferentially into four areas, i.e., areas A to D, each subtending 90 degrees, said wafer stage successively brings the four areas A to D to the pellet removal position of said pellet removal/transfer mechanism by causing 90-degree rotation of the wafer ring unit for each area; and said pellet position correcting mechanism causes 45-degree rotation of the rotary table in one direction when a pellet is removed by said pellet removal/transfer mechanism from the area A, causes 135-degree rotation of the rotary table in afore-said one direction when a pellet is removed from the area B, causes 135-degree rotation of the rotary table in the other direction when a pellet is removed from the area C, and causes 45-degree rotation of the rotary table in the afore-said other direction when a pellet is removed from the area D.

9. The pellet bonding apparatus according to claim 3, wherein:

when the pellet group of the wafer ring unit is divided circumferentially into four areas, i.e., areas A to D, each subtending 90 degrees, said wafer stage successively brings the four areas A to D to the pellet removal position of said pellet removal/transfer mechanism by causing 90-degree rotation of the wafer ring unit for each stage; and said pellet position correcting mechanism causes 45-degree rotation of the rotary table in one direction when a pellet is removed by said pellet removal/transfer mechanism from the area A, causes 135-degree rotation of the rotary table in afore-said one direction when a pellet is removed from the area B, causes 135-degree rotation of the rotary table in the other direction when a pellet is removed from the area C, and causes 45-degree rotation of the rotary table in the afore-said other direction when a pellet is removed from the area D.

10. A pellet bonding apparatus comprising a wafer stage capable of installation thereon via a sheet expander of a wafer ring unit having a sheet with wafer division pellets applied thereto, and a pellet removal/transfer mechanism for removing pellets one by one from the wafer ring unit and transferring each removed unit, said sheet expander including:
an expander ring formed on an expander base provided on said wafer stage, the expander ring having an end capable of supporting the sheet, the expander ring end having a fluid outlet;
a press ring disposed outside the expander ring, the press ring being capable of relative axial movement to said expander ring to cause the sheet supported on the end of the expander ring to be expanded to form a gap between adjacent ones of the pellets; and
a fluid supply system capable of forming a fluid layer between the sheet and the end of the expander ring by supplying fluid to the fluid outlet.

11. The pellet bonding apparatus according to claim 10, wherein the fluid outlet is constituted by air outlet ports open at the end of the expander ring.

12. A pellet bonding apparatus comprising:
a wafer stage capable of installation thereon via a sheet expander of a wafer ring unit having a sheet with wafer division pellets applied thereto;
a pellet removal/transfer mechanism for removing pellets one by one from the pellet group of the wafer ring unit at a pellet removal position and transferring each removed pellet;
a pellet position correcting mechanism for setting each removed pellet on a rotary table and correcting the position of the pellet; and
a bonding mechanism for removing each pellet having been position corrected by said pellet position correcting mechanism and bonding the removed pellet to a lead frame;
said wafer stage permitting rotation of the wafer ring unit through each angle corresponding to each of a plurality of areas, which the pellet group of the wafer ring unit is divided into;
said pellet position correcting mechanism being capable of correcting pellet position by causing rotation of the rotary table through a predetermined angle in either forward or reverse direction independently of the rotation of the wafer ring unit such that each pellet has the same orientation when removed by said bonding mechanism;
said sheet expander including:
an expander ring formed on an expander base provided on said wafer stage, the expander ring having an end capable of supporting the sheet, the expander ring end having a fluid outlet;
a press ring disposed outside the expander ring, the press ring being capable of relative axial movement to said expander ring to cause the sheet supported on the end of the expander ring to be expanded to form a gap between adjacent ones of the pellets; and
a fluid supply system capable of forming a fluid layer between the sheet and the end of the expander ring by supplying fluid to the fluid outlet.

* * * * *